(12) United States Patent
Veloso et al.

(10) Patent No.: US 11,217,488 B2
(45) Date of Patent: Jan. 4, 2022

(54) METHOD OF FORMING A SEMICONDUCTOR DEVICE

(71) Applicant: IMEC vzw, Leuven (BE)

(72) Inventors: Anabela Veloso, Leuven (BE); Trong Huynh Bao, Leuven (BE); Raf Appeltans, Haasrode (BE)

(73) Assignee: IMEC zvw, Leuven (BE)

( * ) Notice: Subject to any disclaimer, the term of this patent is extended or adjusted under 35 U.S.C. 154(b) by 0 days.

(21) Appl. No.: 16/835,786

(22) Filed: Mar. 31, 2020

(65) Prior Publication Data

US 2020/0312721 A1    Oct. 1, 2020

(30) Foreign Application Priority Data

Apr. 1, 2019    (EP) .................................... 19166609

(51) Int. Cl.
*H01L 21/8234* (2006.01)
*H01L 21/311* (2006.01)

(52) U.S. Cl.
CPC .......... *H01L 21/823475* (2013.01); *H01L 21/31111* (2013.01); *H01L 21/823418* (2013.01);
(Continued)

(58) Field of Classification Search
CPC ....... H01L 21/823475; H01L 21/31111; H01L 21/823418; H01L 21/823437;
(Continued)

(56) References Cited

U.S. PATENT DOCUMENTS 9,773,913 B1    9/2017  Balakrishnan et al.
2011/0127605 A1    6/2011  Kim
(Continued)

FOREIGN PATENT DOCUMENTS

EP    3 070 737 A1    9/2016
WO    WO 2018/118097    6/2018

OTHER PUBLICATIONS

Extended European Search Report dated Oct. 22, 2019 for European Patent Application No. 19166609.8 in 8 pages.
(Continued)

*Primary Examiner* — Karen Kusumakar
*Assistant Examiner* — Adam S Bowen
(74) *Attorney, Agent, or Firm* — Knobbe, Martens, Olson & Bear, LLP (57) ABSTRACT

The disclosed technology generally relates to semiconductor devices and methods of forming the same. In one aspect, a method of forming a semiconductor device having vertical channel field-effect transistor (FET) devices comprises forming on a substrate, a plurality of semiconductor structures protruding vertically from a lower source/drain semiconductor layer of the substrate. The semiconductor structures can be arranged in an array having a plurality of rows and columns. The method can include etching metal line trenches between at least a subset of the rows and forming metal lines in the metal line trenches to contact the lower source/drain layer. The method can also include forming gate structures at least partly enclosing semiconductor structure channel portions located above the lower source/drain layer and forming upper source/drain metal contacts on semiconductor structure upper source/drain portions located above the channel portions.

21 Claims, 8 Drawing Sheets

(52) U.S. Cl.
CPC ........... *H01L 21/823437* (2013.01); *H01L 21/823487* (2013.01)

(58) Field of Classification Search
CPC ........... H01L 21/823487; H01L 27/092; H01L 21/823425; H01L 29/41741; H01L 29/1079; H01L 29/775; H01L 29/66439; H01L 29/0676; H01L 29/66666; H01L 27/088; H01L 29/7827; B82Y 10/00
See application file for complete search history.

(56) References Cited

U.S. PATENT DOCUMENTS

| | | | |
|---|---|---|---|
| 2014/0061778 A1* | 3/2014 | Myung | H01L 29/41741 257/329 |
| 2014/0339631 A1 | 11/2014 | Ting et al. | |
| 2016/0093611 A1 | 3/2016 | Cheng et al. | |
| 2017/0092355 A1 | 3/2017 | Kurotsuchi et al. | |
| 2018/0082953 A1 | 3/2018 | Bi et al. | |

OTHER PUBLICATIONS

Verma et al., "Novel $4F^2$ Buried-Source-Line STT MRAM Cell With Vertical GAA Transistor as Select Device", IEEE Transactions on Nanotechnology, vol. 13, No. 6, pp. 1163-1171, Nov. 2014.

Verma et al., "Low Power STT MRAM Cell With Asymmetric Drive Current Vertical GAA Select Device", IEEE 12th International Conference on Electrical Engineering/Electronics, Computer, Telecommunications and Information Technology, Jun. 2015, 5 pages.

* cited by examiner

METHOD OF FORMING A
SEMICONDUCTOR DEVICE

CROSS-REFERENCE TO RELATED APPLICATIONS

This application claims foreign priority to European Patent Application EP 19166609.8, filed Apr. 1, 2019, the content of which is incorporated by reference herein in its entirety.

BACKGROUND

Technical Field

The disclosed technology generally relates to semiconductor devices, and more particularly to methods of forming semiconductor devices such as field-effect transistor (FET) devices.

Description of the Related Technology

In striving to provide more power- and area-efficient circuit designs, new transistor devices are being developed. One type of non-planar field-effect transistor (FET) device is the vertical channel FET device.

Vertical channel FET devices (also referred to as VFET devices) include the vertical nanowire- or nanosheet-FET (vertical NWFET or NSFET) having a gate at least partly, or completely, enclosing a channel portion of a vertically oriented nanowire or nanosheet semiconductor structure.

Owing to their vertically oriented channel structure, the gate length of VFET devices may not be influenced by the linewidth, but instead by the vertical dimension or thickness of the gate electrode. Secondly, the source and drain portions of a vertical transistor device are vertically displaced in relation to each other. For these reasons, among others, VFET devices may be implemented in dense and area efficient arrays.

To form functioning circuits, the source/drains of the devices are contacted. However, due to the vertical orientation of the channel structures and the vertical displacement of the source and drains, contacting the lower sources (or drains as the case may be) may be more challenging than contacting of horizontal channel devices. Typically, for VFETs, contacting may rely on providing vertical metal via connections interspersed in the array of VFETs to contact each source/drain. However, to allow low-resistance connections, the vertical vias have a certain minimum cross-section, which may be challenging to accommodate in dense arrays.

SUMMARY OF CERTAIN INVENTIVE ASPECTS

An objective of the disclosed technology is therefore to provide a method allowing low-resistance lower source/drain connections even in dense VFET arrays. Further and alternative objectives may be understood from the following.

According to an aspect of the disclosed technology, a method of forming a semiconductor device having vertical channel field-effect transistor (VFET) devices comprises forming on a substrate, a plurality of semiconductor structures protruding vertically from a lower source/drain semiconductor layer of the substrate. The semiconductor structures can be arranged in an array having a plurality of rows and columns. The method can include etching metal line trenches between at least a subset of rows (parallel to the rows in some instances). The method can also include forming metal lines in the metal line trenches to contact the lower source/drain layer, forming gate structures at least partly enclosing channel portions of the semiconductor structures located above the lower source/drain layer, and forming upper source/drain metal contacts on upper source/drain portions of the semiconductor structures located above the channel portions.

According to some methods, lower source/drains of the VFETs in an array may be contacted with horizontally extending metal lines running through the array of VFETs, parallel to (e.g., substantially parallel to) and in between rows of the array. Each metal line may be formed in a metal line trench etched in the substrate. As used herein, reference to "each" of a particular element (e.g., "each metal line") may refer to two or more of the elements, and may or may not refer to every one of the elements in the device. For example, "each metal line" may refer to individual ones of a plurality of metal lines and not necessarily every single metal line in the device.

A resistance of the source/drain connection may accordingly be adapted via a vertical dimension (e.g., height) of the metal lines. For example, a greater line height increases the cross-sectional area of the metal line and thus can decrease the resistance.

A further advantage in some implementations is that VFETs arranged along a same row may be connected to a same metal line. In some instances, VFETs arranged along a pair of adjacent rows may be connected to a common metal line formed in-between. Some such designs can allow area-efficient VFET arrays, compared to providing a plurality of individual vertical vias along each row. Each of the metal line trenches may advantageously extend across a plurality of columns of the array.

As may be appreciated, the metal lines may accordingly be connected to an back-end-of-line (BEOL) interconnect structure at a few select positions, e.g., at the edges of or outside of the array.

As used herein, a vertical channel FET (VFET) device may refer to a device comprising a semiconductor structure comprising a lower and an upper source/drain portion and a channel portion located intermediate and extending vertically between the lower and upper source/drain portions, and further comprising a gate structure extending vertically along the channel portion. The gate structure may at least partially enclose the channel portion. In some instances, the gate structure may wrap-around the channel portion, for example, forming a gate-all-around (GAA) structure. The lower and upper source/drain portions and the channel portion may intersect a common vertical plane. The channel portion can be adapted to (in use of the device) conduct a vertically flow of charge carriers between the source/drains.

As used herein, vertical may refer to a direction or orientation (e.g., of a surface, a dimension, or other feature) parallel to a normal to the substrate (e.g., a main plane of extension or main/upper surface thereof). As used herein, horizontal may refer to a direction or orientation parallel to the substrate (e.g., a main plane of extension or main surface thereof), or transverse to the vertical direction. Meanwhile, terms such as "above", "upper", "top" and "below", "lower", "bottom" can refer to relative positions as viewed along the vertical direction, and does not imply an absolute orientation of the substrate or device.

According to some methods, the semiconductor structures can be arranged in an array having a plurality of (horizontal)

rows and (horizontal) columns. For example, the method can comprise forming an array having rows and columns of semiconductor structures. Each semiconductor structure may accordingly be arranged at a crossing of a row and a column of the array.

The rows may extend in a first horizontal direction (e.g., a row direction) along the substrate. The columns may extend in a second horizontal direction (e.g., a column direction) along the substrate. The row and column directions may be transverse to each other. The rows may be, in some instances, equally spaced apart as viewed in the column direction. The columns may be, in some instances, equally spaced apart as viewed in the row direction.

Metal line trenches may be formed between every row of the array, or between only a subset of the rows of the array (e.g., a strict subset of the rows). Each metal line trench may be formed between a respective pair of adjacent rows. For instance, a first metal line trench may be formed between a first pair of adjacent rows, and a second metal line trench may be formed between a second pair of adjacent rows, etc.

The method may further comprise, prior to forming the metal lines, forming an insulating spacer layer on semiconductor structure sidewalls along at least a subset of rows.

An insulating spacer may accordingly be formed on at least the sidewalls of the semiconductor structures arranged along at least a subset of rows.

A spacer layer on the sidewalls of the semiconductor structures can enable at least a minimum amount of electrical isolation between the metal lines and the semiconductor structures, including for instance, a base portion of the semiconductor structure.

A further advantage in some implementations is that the height of the metal lines may be increased to exceed a depth of the metal line trenches, without risking shorting between the sidewalls of the semiconductor structures (e.g., base portions thereof) and the metal lines.

The spacer layer may, in some instances, be formed prior to forming the metal line trenches. Thereby, the spacer layer may mask the sidewalls during the metal line trench formation. The sidewalls of the semiconductor structures may hence be masked from process steps used during the metal line trench formation, such as etching of the semiconductor material of the lower source/drain layer.

The method may, in some instances, further comprise forming a cover layer at least partly embedding the semiconductor structures and at least partly covering the lower source/drain layer. The method can also include forming trenches in the cover layer. The trenches can extend through the cover layer between at least a subset of the rows. The metal line trenches can be formed by etching the lower source/drain layer via the trenches in the cover layer.

The cover layer may thus mask lower source/drain layer portions between any rows where metal line trenches are not to be formed during the metal line trench formation. The cover layer may further at least partly cover lower source/drain layer portions extending between semiconductor structures of a same row during the metal line trench formation. The cover layer may be an insulating layer, for instance, an oxide layer or a dielectric layer. The cover layer may hence remain to act as an insulating layer in subsequent process steps and in the final device.

The trenches in the cover layer may be formed to expose sidewalls of the semiconductor structures arranged along at least a subset of the rows. The method may further comprise forming an insulating spacer layer on sidewalls of the semiconductor structures exposed in the trenches in the cover layer.

In some implementations, the spacer layer may thus provide electrical isolation between the metal lines and the exposed sidewalls of the semiconductor structures. The spacer layer may further mask the sidewalls during the (semiconductor material) etching of the metal line trenches.

Alternatively, the method may further comprise, prior to forming the cover layer, depositing a conformal layer at least partly covering the semiconductor structures and the lower source/drain layer. Subsequent to forming the cover layer, the trenches in the cover layer can be formed by etching the cover layer selectively with respect to the conformal layer. For example, depositing a conformal layer of a material different from a material of the cover layer can allow the trench formation in the cover layer to proceed without exposing the sidewalls of the semiconductor structures. Conformal layer portions formed on the lower source/drain layer may be removed prior to or after forming the cover layer by a vertical anisotropic etch of the conformal layer. The conformal layer may thus be removed selectively from the lower source/drain layer and remain as a spacer layer on the sidewalls of the semiconductor structures. In some instances, the conformal layer portions on the lower source/drain layer may be removed prior to etching the metal line trenches.

The metal lines may be formed with a height which is greater than a depth of the metal line trenches. Hence, the resistance of the metal lines may be reduced. This can be combined with forming of the insulating spacer layer on the sidewalls of the semiconductor structures to reduce the risk of shorting.

Forming the metal lines may comprise depositing metal line material in the metal line trenches and etching back the deposited metal line material to a level below the channel portions. Accordingly, upper surfaces of the metal lines may be etched back to a level below the channel portions. Hence, a vertical space may be created to form the gate structures along the channel portions.

The method may further comprise at least partly covering the metal lines with an insulating layer. The gate structures may be formed on the insulating layer. The metal lines and the gate structures may thus be electrically insulated from each other.

Each upper source/drain metal contacts may be formed on two semiconductor structure upper source/drain portions of at least two consecutive rows. This can enable a multi-channel VFET device. For example, the channels of the semiconductor structures of the consecutive rows may be connected between an electrically common metal line (e.g., formed in contact with a lower source/drain layer portion) and a common upper source/drain metal contact.

Each upper source/drain metal contact may extend over and across at least one of the metal lines. Hence, a metal line may be provided in proximity to the base portions of the consecutive semiconductor structures. This may, in some instances, reduce a series resistance of each multi-channel VFET device.

The method may further comprise, prior to or after forming the metal lines (and the metal line trenches), forming trenches in the lower source/drain layer between a number of rows of the array, and filling the trenches with an insulating material, thereby dividing the lower source/drain layer into a number of lower source/drain layer portions. At least one metal line trench and metal line can be formed in each lower source/drain layer portion. Hence, individual islands of lower source/drain layer portions (also referred to as bottom electrode regions) may be defined. By each lower source/drain layer portion contacting at least one metal line, the lower source/drains of the VFETs of each island may be accessed via a low-resistance connection. These insulation-filled trenches may, in some instances, be formed to extend completely through the lower source/drain layer and into a substrate layer below. This may improve the degree or electrical isolation between the lower source/drain layer portions in some implementations.

In some examples, a metal line trench and a metal line may be formed between every row of semiconductor structures supported by each lower source/drain portion. Each lower source/drain portion may accordingly be accessed in parallel by more than one metal line. This can allow a further reduction of the device series resistance in some implementations.

The etching of the metal line trenches may comprise etching the lower source/drain layer. The metal lines can be formed in the metal line trenches in the lower source/drain layer. The etching of the lower source/drain layer may, for instance, extend only partially through the lower source/drain layer.

The etching of the metal line trenches may also comprise etching through the lower source/drain layer and into an underlying substrate layer, thereby forming an upper trench portion in the lower source/drain layer and a lower trench portion in the underlying substrate layer, and performing a lateral etch back of sidewalls of the lower trench portions to form widened lower trench portions. The metal lines can be formed in at least the widened lower trench portions.

Thereby, in some instances, even wider metal lines may be at least partly embedded in the substrate. The metal lines may be formed to contact the lower source/drain layer at least from an underside.

The lateral etch back may be facilitated if the underlying substrate layer and the lower source/drain layer are formed of different semiconductor materials, e.g., $Si_{1-x}Ge_x$ forming the underlying substrate layer and $Si_{1-y}Ge_y$ forming the lower source/drain layer, with $0 \leq x \leq 1$ and $0 \leq y \leq 1$ with $1 \pm y$.

The method may further comprise cutting each metal line in a longitudinal direction thereof, thereby forming two separate parallel metal line parts in each widened lower trench portion. Hence, two electrically separate metal lines may be formed in each metal line trench. This may be advantageous if separate access to the lower source/drains of VFETs in adjacent rows is desired.

According to a further aspect of the disclosed technology, a semiconductor device comprises a substrate and a plurality of VFET devices. The plurality of VFET devices can comprise a plurality of semiconductor structures protruding vertically from a lower source/drain semiconductor layer of the substrate. The semiconductor structures can be arranged in an array having a plurality of rows and columns. Gate structures can at least partly enclose channel portions of the semiconductor structures located above the lower source/drain layer. The devices can also include upper source/drain metal contacts on upper source/drain portions of the semiconductor structures located above the channel portions. Metal line trenches can be formed in the lower source/drain semiconductor layer between at least a subset of the rows (and extending parallel to the rows in some instances). Metal lines can be arranged in the metal line trenches. The metal lines can contact the lower source/drain layer.

The above details and advantages discussed above in connection with the disclosed methods, and the embodiments thereof, apply correspondingly to the devices, wherefore reference is made to the above.

BRIEF DESCRIPTION OF THE DRAWINGS

The above, as well as additional objects, features and advantages of the disclosed technology, will be better understood through the following illustrative and non-limiting detailed description, with reference to the appended drawings. In the drawings like reference numerals will be used for like elements unless stated otherwise.

DETAILED DESCRIPTION OF CERTAIN ILLUSTRATIVE EMBODIMENTS

A semiconductor device comprising VFET devices and a method of forming the semiconductor device will now be described with reference to the figures. Unless stated otherwise, the figures show in perspective a section of a substrate 100 comprising an array (or at least a portion of an array) of vertical semiconductor structures of VFETs. The illustrated planes of section extending through the substrate 100 may be common to all the figures, e.g., unless indicated otherwise. As may be appreciated, the substrate 100 may typically present a much greater lateral/horizontal extension than shown, beyond the illustrated section. It may further be noted that the relative dimensions of the shown structures, for instance the relative thickness of layers, is merely schematic and may, for the purpose of illustrational clarity, differ from a physical device structure.

Figure 1:
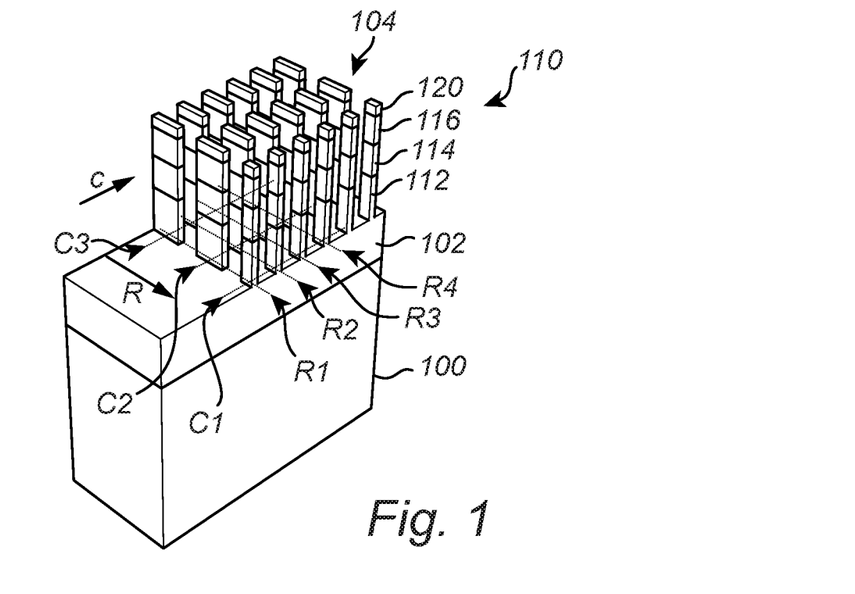
FIGS. 1, 2, 3, 4, 5, 6, 7, 8, 9, 10, 11, and 12 illustrate various intermediate structures of a method of forming a semiconductor device.

FIG. 1 shows the starting substrate 100 for the process. The substrate 100 may be a semiconductor substrate, e.g., a substrate comprising at least one semiconductor layer. The substrate 100 may be a single-layered semiconductor substrate, for instance, formed by a bulk substrate. The substrate may however also be a multi-layered substrate, for instance, formed by an epitaxially grown semiconductor layer on a bulk substrate, or a semiconductor-on-insulator (SOI) substrate. The substrate 100 may, for instance, comprise a layer of silicon (Si), germanium (Ge) or silicon germanium (SiGe).

As further shown in FIG. 1, a plurality of semiconductor structures 110 have been formed on the substrate 100. The semiconductor structures 110 protrude vertically from a lower source/drain semiconductor layer 102 of the substrate 100.

The particular semiconductor structures 110 shown in FIG. 1 may be formed by patterning a stack of epitaxial lower, intermediate, and upper semiconductor layers, such that each semiconductor structure 110 comprises a lower portion or base portion 112, an intermediate portion 114, and an upper portion 116. The lower and upper portions 112, 116 of a pillar 110 may be used to form the lower and upper source/drains, respectively, of the final VFET, and may therefore hereinafter be referred to as lower source/drain portion 112 and upper source/drain portion 116, respectively. Similarly, the intermediate layer 114 may be used to accommodate the channel of the final VFET, and may therefore hereinafter be referred to as channel portion 114. Accordingly, the channel portion 114 can be arranged intermediate the source/drain portions 112, 116 and extending vertically between the two. For example, the source/drain portions 112, 116 can be located at vertically opposite ends of the channel portion 114. The disclosed technology can be applicable to junction less devices as well as inversion mode devices and the pillars 110 may be doped accordingly. The layers 112, 114, 116 may, for instance, be formed by chemical vapor deposition (CVD), physical vapor deposition (PVD), or metal-organic vapor phase epitaxy (MOVPE). Example layer stacks include a SiGe/Si/SiGe layer stack, a SiGe/Ge/SiGe layer stack, or a SiGe/SiGe/SiGe layer stack wherein the intermediate layer can have a different Ge-content than the lower and upper layers. Semiconductor structures also may be patterned in layer stacks comprising more layers or fewer layers, and even in a single epitaxial semiconductor layer.

The lower source/drain layer 102 may be heavily doped with a conductivity type in accordance with the type of VFET devices that are to be formed (e.g., p- or n-type). The lower source/drain layer 102 may be formed by a further epitaxial semiconductor layer separate from the layer or layers defining the semiconductor structures 110. However, the lower source/drain layer 102 may also be formed by a thickness portion of, e.g., the lower layer of the layer stack remaining following the patterning of the semiconductor structures 110 (e.g. a lower SiGe layer). In any case, the lower source/drain layer 102 and the lower source/drain portions 112 protruding therefrom, may together define lower source/drains or lower source/drain regions for the VFETs to be formed.

The forming of the semiconductor structures 110 may proceed in a any patterning manner, for instance, by patterning (e.g., using lithography and etching) the one or more epitaxial semiconductor layers formed on the substrate 100. For example, patterning of the semiconductor structures 110 may comprise defining a patterned mask, such as a hard mask (e.g., of silicon nitride such as $Si_3N_4$, spin-on-carbon or a carbon-based patterning film), on the one or more epitaxial semiconductor layers and etching the one or more epitaxial semiconductor layers while using the patterned mask as an etch mask. As shown in FIG. 1, mask portions of the patterned mask may remain on top of the patterned channel structures as caps 120.

As shown, the semiconductor structures 110 may be formed as vertically oriented nanosheets, e.g., with an oblong rectangular cross-sectional shape. However, it is also possible to form the semiconductor structures 110 as vertically oriented nanowires, e.g., with a square or rounded cross-sectional shape. For ease of readability, the semiconductor structures 110 may in the following be referred to as pillars.

As indicated in FIG. 1, the pillars 110 can be formed in an array 104 having a plurality of rows R1, R2, R3, R4 and columns C1, C2, C3. The rows R1-R4 extend in parallel to (e.g., substantially parallel to) a row direction R. The columns extend in parallel to (e.g., substantially parallel to) a column direction C. The rows R1-R4 may be regularly spaced along the column direction C in some instances. The columns C1-C3 may be regularly spaced along the row direction R in some instances. Each pillar 110 can be accordingly arranged at a crossing of a row and a column. It should be noted that FIG. 1 may depict only a small part of the array 104, which may comprise hundreds or thousands of rows and columns of pillars 110 in some implementations.

Figure 2:
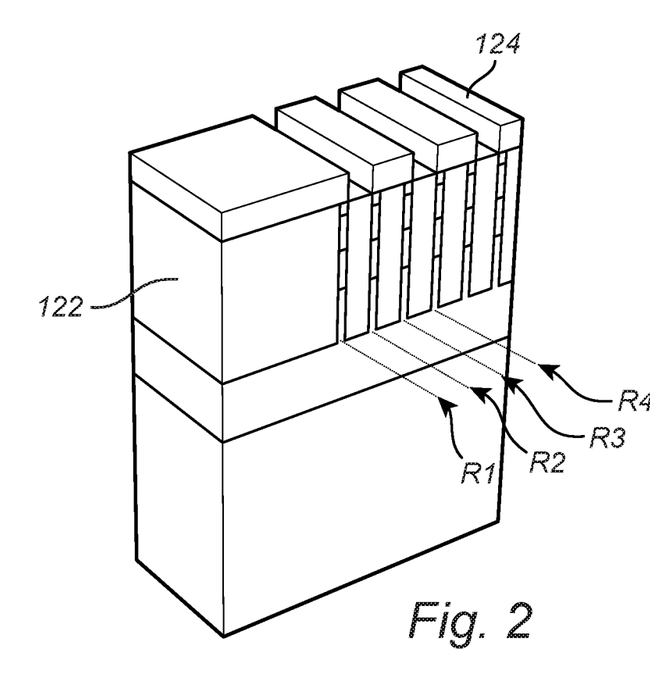

In FIG. 2, the pillars 110 have been at least partly embedded in a cover layer 122. The cover layer 122 may be formed of an insulating material, for instance of silicon dioxide ($SiO_2$), or another low-K dielectric. The cover layer 122 may be formed by depositing insulating material (e.g., by CVD), followed by etch back and/or polishing to reduce a thickness of the cover layer 122 to expose the upper surfaces of the pillars 110 (or as in the illustrated case to expose the caps 120 formed thereon).

A mask 124 has been formed above the insulating cover layer 122, defining openings above and between a subset of the rows, e.g., between rows R1 and R2, and between R3 and R4, etc. The openings can define positions of metal line trenches which are to be formed in the lower source/drain layer 102 between the rows. The mask may be of any type, such as a resist-based mask patterned using lithography.

Figure 3:
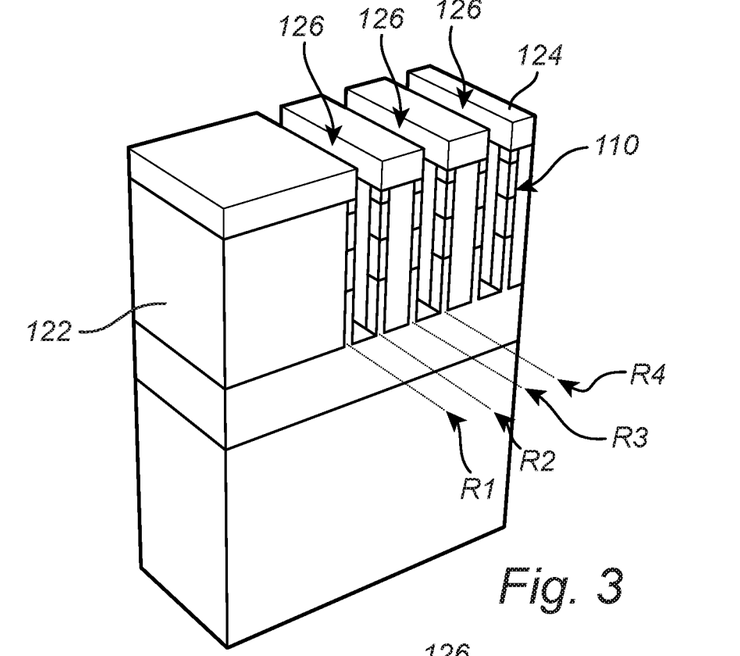

In FIG. 3, trenches 126 have been formed in the cover layer 122, e.g., the trenches 126 extending through the cover layer 122 between the subset of rows. The trenches 126 may be formed by etching the cover layer 122 via the openings defined in the mask 124. The trenches 126 may be etched using any etch suitable for etching dielectric material, e.g., a dry-etch process. The mask 124 may be removed after the trenches 126 have been formed. The trenches 126 may expose the lower source/drain layer 102 between the subset of rows. As indicated in FIG. 3, a width of each trench 126 may be such that sidewalls of the pillars 110 arranged along the trench 126 are exposed.

Figure 4:
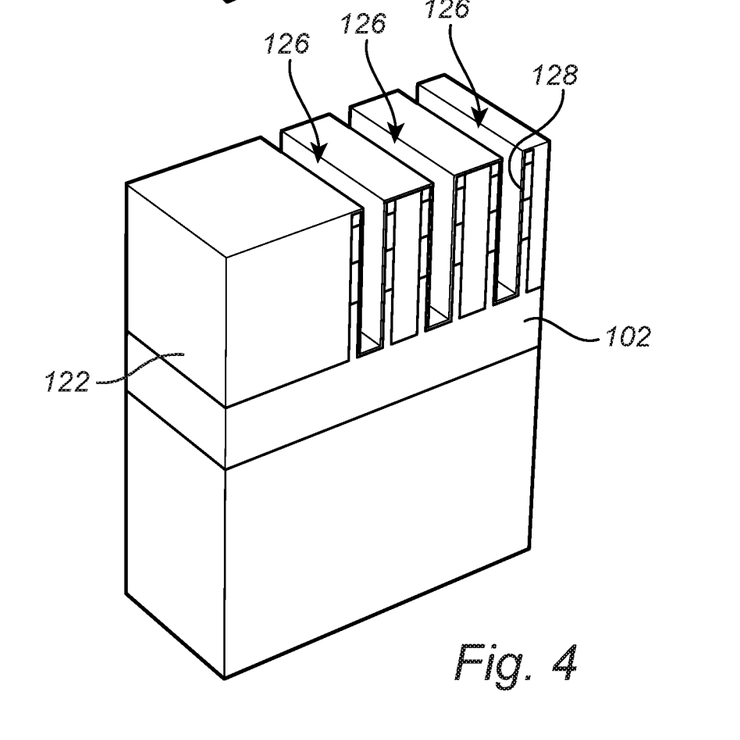

In FIG. 4, an insulating spacer layer 128 has been formed to at least partly cover sidewalls of the pillars 110 exposed in the trenches 126 in the cover layer 122. As shown, the spacer layer 128 may be deposited as a conformal layer at least partly covering the sidewalls of the trenches 126. The spacer layer 128 may further at least partly cover an upper surface of the cover layer 122 and surface portions of the lower source/drain layer 102 exposed at the bottom of the trenches 126. The spacer layer 128 may be an oxide- or nitride-layer, for instance, a layer of $SiO_2$ or silicon nitride such as SiN, formed by ALD.

Figure 5:
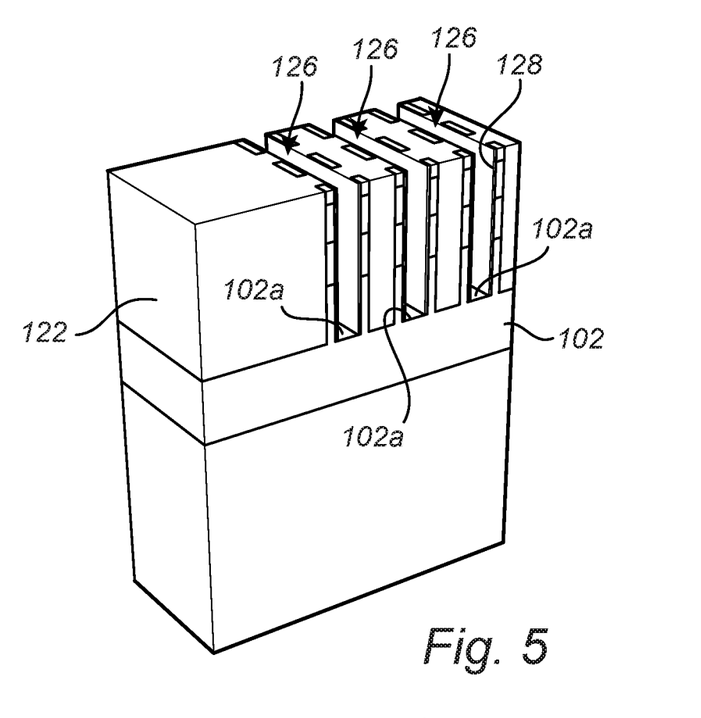

In FIG. 5, portions of the spacer layer 128 deposited on horizontally oriented surfaces have been removed, such that portions of the spacer layer 128 remain to form an insulating sidewall spacer 128 on the sidewalls of the trenches 126, and thus at least partly covering the sidewalls of the pillars 110 previously exposed in the trenches 126. This may be achieved by a vertical anisotropic etch of the originally deposited spacer layer 128, for instance, a short dry-etch step. Upper surface portions 102a of the lower source/drain layer 102 can be exposed at the bottom of the trenches 126.

Figure 6:
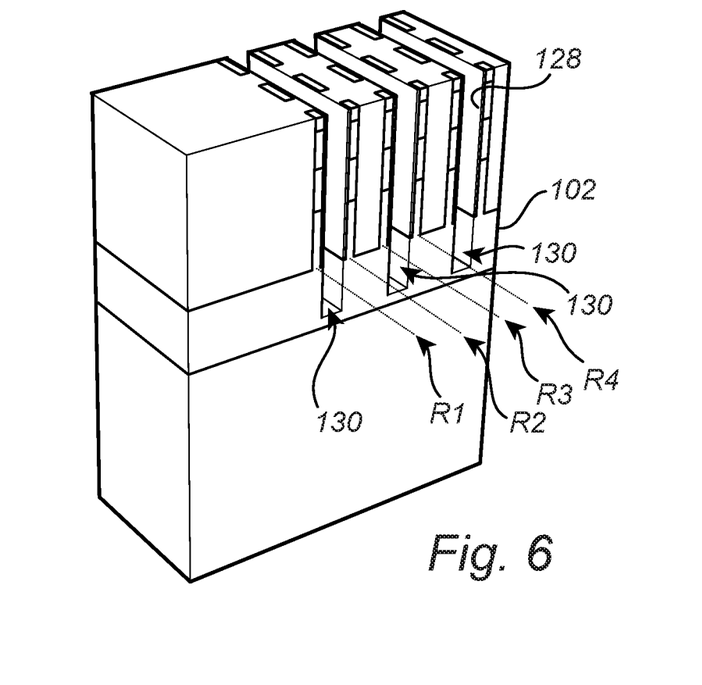

In FIG. 6, metal line trenches 130 have been etched between the subset of rows R1 and R2, R3 and R4, etc. Each metal line trench 130 accordingly can extend parallel to (e.g., substantially parallel to) and between a respective pair of adjacent rows in some implementations. The metal line trenches 130 may be formed by etching into the lower source/drain layer 102 via the trenches 126 in the cover layer 122. Any wet- or dry-etching process suitable for semiconductor etching may be used, such as etching processes allowing etching of Si or SiGe including, but not limited to sulfur hexafluoride ($SF_6$) or tetrafluoromethane ($CF_4$) comprising etchants. During the etching, the sidewall spacer 128 may mask the sidewalls of the pillars 110 facing the trenches 126 and hence counteract etching of the pillars 110. As shown, the etching may extend partially through the lower source/drain layer 102 such that a thickness portion of the lower source/drain layer 102 remains under each trench 130. However, it is also possible to extend the etching completely through the lower source/drain layer 102, e.g., stopping at the interface between the lower source/drain layer 102 and the underlying semiconductor layer of the substrate 100.

Figure 7:
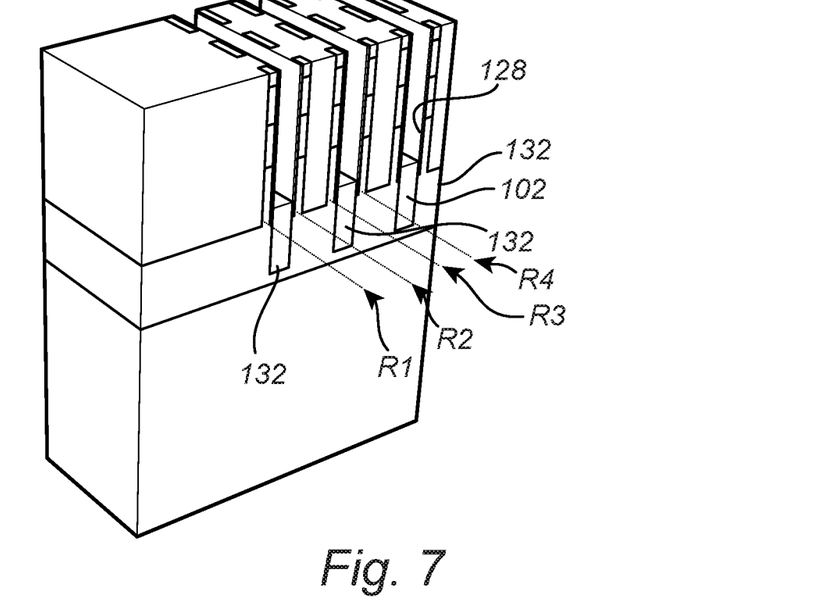

In FIG. 7, metal lines 132 have been formed in the metal line trenches 130. The metal lines 132 may hence be formed in physical and electrical contact with the lower source/drain layer 102. The metal lines 132 may, as shown, be formed with a vertical dimension or height which can be greater than a depth of the metal line trenches 130. Hence, the metal lines 132 may vertically overlap the base portions/lower source/drain portions 112 of the pillars 110. The sidewall spacer 128 may in this case, provide isolation between the metal lines 132 and the sidewalls of the lower source/drain portions 112. The metal lines 132 may be formed by depositing metal line material, for instance aluminum (Al), copper (Cu), tungsten (W), or ruthenium (Ru), in the metal line trenches 130 and etching back the deposited metal line material to a level below the channel portions 114 of the pillars 110. Any metal etching process may be used, e.g., which allows selective etching of the metal with respect to e.g., the materials forming the sidewall spacer 128 and the cover layer 122.

Figure 8:
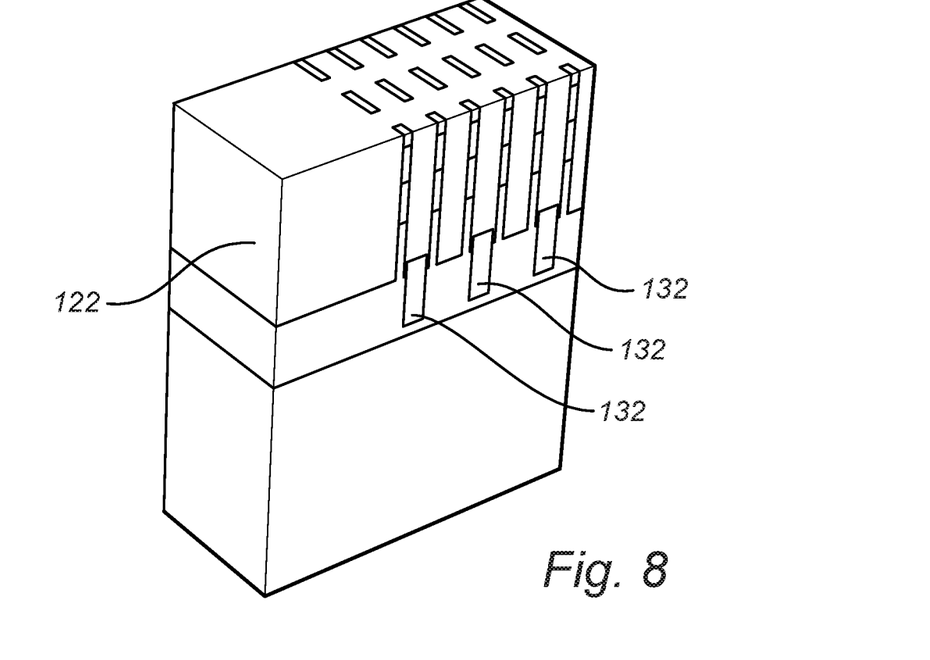

In FIG. 8, the metal lines 132 have been at least partly covered with an insulating material, thereby closing the trenches 126 in the cover layer 122. In some instances, a same insulating material as forming the originally deposited cover layer 122 may be deposited to fill the trenches 126. The deposited insulating material may be polished, e.g., by chemical-mechanical polishing (CMP) and optionally etched back to form the cover layer 122 at least partly embedding the pillars 110 and exposing the caps 120.

If the cover layer 122 is formed of a material of a type not desired in the final device (such as an organic spin-on layer or the like in some instances), the cover layer 122 may first be stripped and then re-deposited as a new cover layer 122 of a suitable insulating material, such as a $SiO_2$ or another low-k dielectric.

Figure 9:
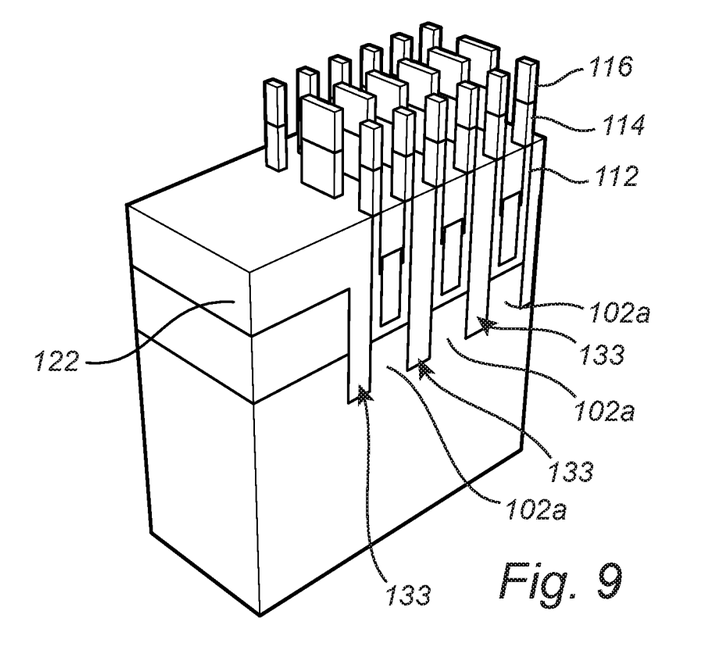

In FIG. 9, trenches 133 have been formed in the lower source/drain layer 102 between a number of the rows of the array 104. The trenches 133 may be formed by first etching trenches at desired locations in the cover layer 122, and thereafter etching the trenches 133 by etching via the trenches in the cover layer 122. A similar etching process as used to form the metal line trenches 130 may be employed. The trenches 133 have subsequently been filled with an insulating material, e.g., in some implementations, a same material as the cover layer 122. The lower source/drain layer 102 has hence been divided into a number of lower source/drain layer portions 102a. The trenches 133 filled with the insulating material may be referred to as shallow trench insulation (STI) structures. The trenches 133 may in some implementations, extend completely through the lower source/drain layer 102 and into the below substrate 100, to provide a reliable isolation between the lower source/drain layer portions 102a. As shown, the trenches 133 can be formed in some instances with a periodicity of every second row of the array 104. Hence one metal line trench 130 and metal line 132 can be formed in each lower source/drain layer portion 102a. However, this merely represents one example and it is also possible to form the trenches 133 with a lower periodicity, such as one for every three rows, every four rows, etc.

As further shown in FIG. 9, the cover layer 122 has been etched back to expose the upper source/drain portions 116 and the channel portions 114 of the pillars 110. Any sidewall spacer portions 128 may also be removed from the upper source/drain portions 116 and the channel portions 114 of the pillars 110 in a same or subsequent etch step.

Figure 10:
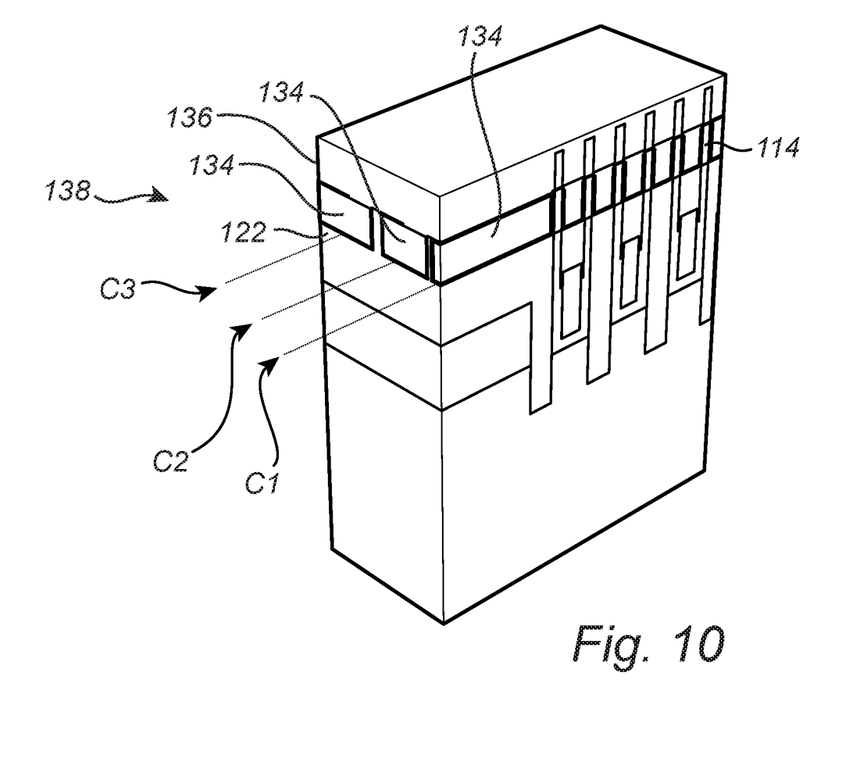

In FIG. 10, gate structures 134 have been formed to at least partly enclose the channel portions 114 of the pillars 110. The gate structures 134 may, as shown, in some implementations, be formed to completely enclose the channel portions 114 in a circumferential direction. The gate structures 134 may be formed as elongated gate structure lines extending along the columns C1-C3 of the array 104, across the rows of the array 104. The gate structures 134 may comprise a gate stack comprising e.g., a gate dielectric layer and a gate electrode formed by one or more gate conductors. Gate dielectric materials include for instance, hafnium dioxide ($HfO_2$), zirconium dioxide ($ZrO_2$), aluminum oxide ($Al_2O_3$), or other high-K dielectric material. The gate dielectric layer may be deposited as a conformal thin film by any deposition process, for instance by ALD. Gate conductors include for instance p-type effective work function metal (EWF) metals such as titanium nitride (TiN), tantalum nitride (TaN), titanium tantalum nitride (TiTaN), or n-type EWF metals such as aluminum (Al), titanium aluminide (TiAl), titanium carbide (TiC), or titanium aluminum carbide (TiAlC), or compound layers such as TiN/TiAl or TiN/TaN/TiAl. Gate conductors further include fill metals such as tungsten (W), aluminum (Al), cobalt (Co), nickel (Ni), ruthenium (Ru), or an alloy of two or more of the materials. The gate conductors may be deposited by any deposition process, for instance by ALD, CVD, or PVD.

The gate structures 134 may be formed by depositing the gate stack and thereafter patterning the deposited gate stack to form the gate structures 134 with a desired horizontal dimensions. However, a replacement metal gate (RMG) flow may also be used wherein dummy gates (e.g., comprising polysilicon) may first be formed and subsequently be replaced by the final gate stack.

Subsequent to forming the gate structures 134, the gate structures may be at least partly covered by an insulating layer 136. The insulating layer 136 may in some implementations, advantageously be formed of a same material as the cover layer 122 such that the cover layer 122 and insulating layer 136 together can define a common insulating layer 138. Etch-back and/or polishing may be performed to planarize the insulating layer 138.

Figure 11:
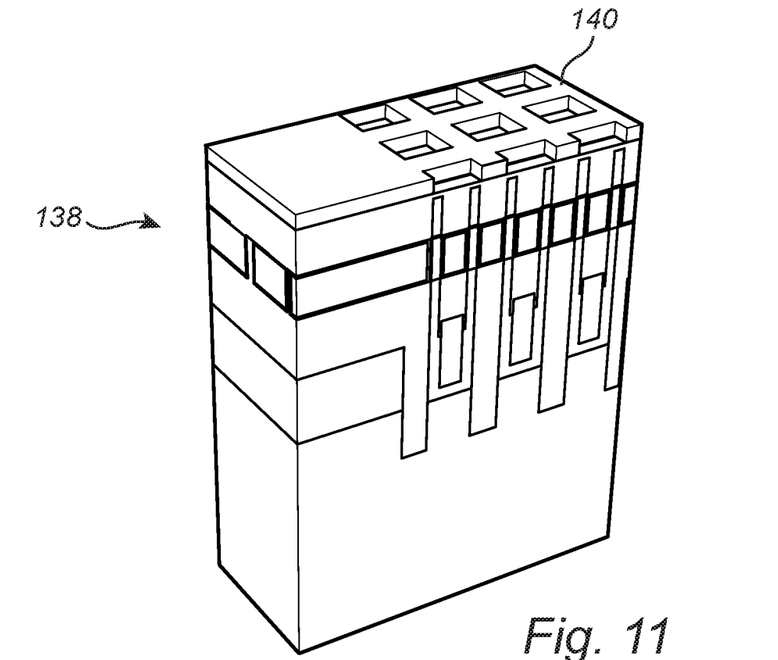

In FIG. 11, an etch mask 140 has been formed above the insulating layer 138. The etch mask 140 can define openings which can be used to define upper source/drain contacts for the VFET devices. The etch mask 140 may be of any type, such as a resist-based mask patterned using lithography.

Figure 12:
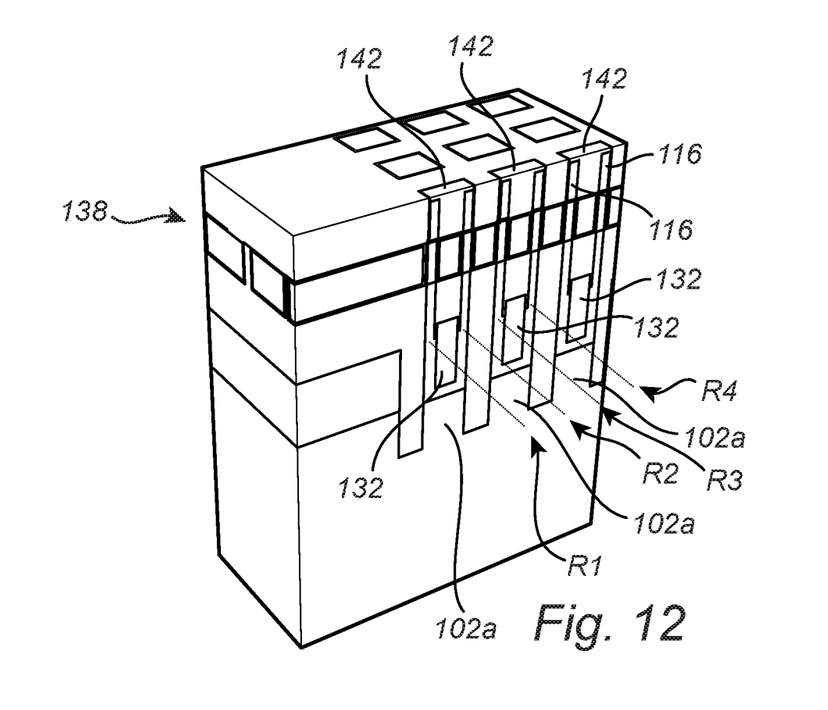

In FIG. 12, source/drain contacts or top electrodes 142 have been formed by etching through the etch mask 140 down to the upper source/drain portions 116 and filling the thus formed trenches with a contact metal, such as for example Al, Co, Ni, W or Ru.

As shown, each upper source/drain metal contacts 142 may be formed on a pair of upper source/drain portions 116 belonging to mutually opposite pillars 110 in adjacent rows. Hence, each source/drain metal contact 142 may extend over and across a respective metal line 132 formed between the adjacent rows.

However other designs of the source/drain metal contacts 142 are also possible. For instance, the upper source/drain metal contacts 142 may be formed to contact only the upper source/drain portion 116 of a single pillar 110, or upper source/drain portions 116 of more than two pillars 110.

Optionally, the deposition of contact metal may be preceded by epitaxially growing doped semiconductor material on the upper source/drain portions 116, to form enlarged upper source/drain portions for improved electrical contact with the source/drain contact structures 142.

The process may thereafter proceed with back-end-of-line-processing (BEOL-processing) etc. Among others, the metal lines 132 may be connected to the BEOL interconnect structure by vertical vias suitable positions, e.g., at the edges of or outside of the array 104.

FIGS. 13-18 illustrate a variation of a method of forming a semiconductor device comprising VFET devices. The FIGS. 13-18 illustrate in plan view cross sections of a part of the array 104, taken along a column direction, across a number of rows R1-R3 etc. Like reference numerals in FIGS. 1-12 and 13-18 can refer to like elements, e.g., unless otherwise stated.

Figure 13:
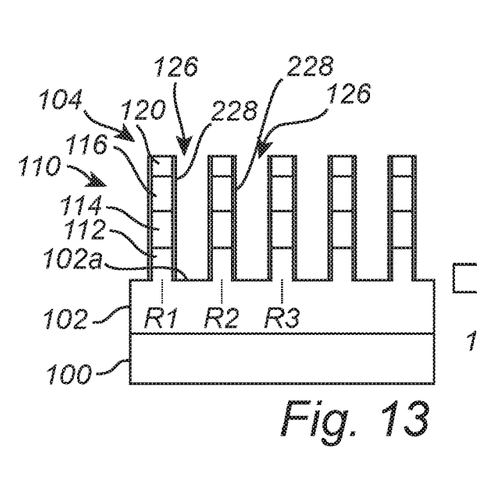
FIGS. 13, 14, 15, 16, 17, and 18 illustrate various intermediate structures of a further method of forming a semiconductor device.

The method generally proceeds in a similar manner as the above up until the stage of forming the metal line trenches 130. FIG. 13 shows the pillars 110 after formation of trenches 126 in a cover layer 122. In contrast to the above method, trenches 126 have been formed between every row of the array 104 and is hence not visible in the cross-sectional view. A conformal insulating layer 228 has been formed to at least partly cover the pillars 110 and the upper surface portions of the lower source/drain layer 102 exposed in the trenches 126. The conformal insulating layer 228 may be formed in a corresponding manner as the spacer layer 128. However, according to a variation, the layer 228 may be formed prior to the cover layer 112 and the trenches 126. The cover layer 122 may thereafter be deposited wherein the trenches 126 may be formed by etching the cover layer 122 selectively with respect to the conformal layer 228. The spacer layer 228 may, for instance, be formed as a SiN-layer wherein a cover layer 122 of $SiO_2$ may be etched selectively with respect to the spacer layer 228.

Figure 14:
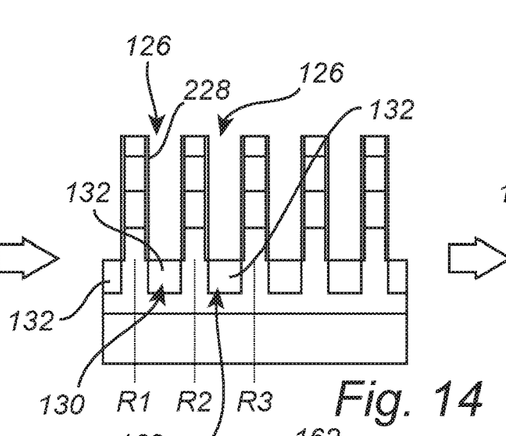

In FIG. 14, the conformal layer 228 has been opened at the bottom of the trenches 126, wherein the remaining portions of the conformal layer 228 remain on the sidewalls of the pillars 110 (and the trenches 126) to form a sidewall spacer layer 228 thereon. Subsequently, in this example, metal line trenches 130 and metal lines 132 have been formed between every row of pillars 110.

Figure 15:
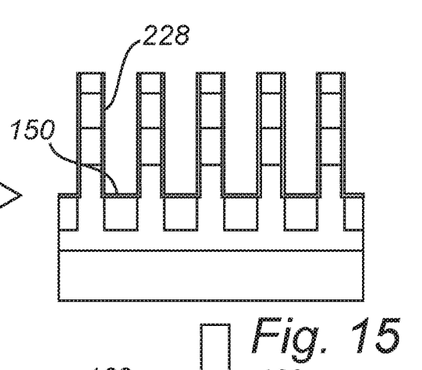

FIG. 15 shows an optional insulating barrier liner 150 deposited on the metal lines 132, e.g., to counteract the material forming the metal lines 132 from contaminating the cover layer 122 in some instances.

Figures 16, 17:
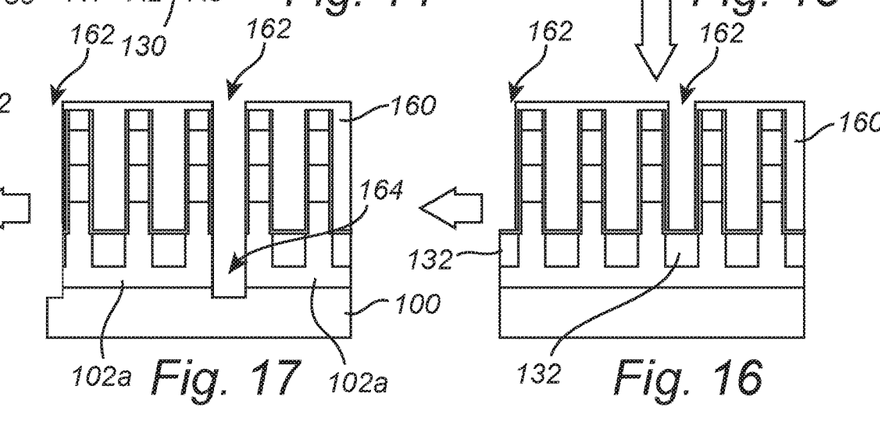

In FIG. 16, a mask layer 160 has been formed above the pillars 110 and the metal lines 132. A number of trench openings 162 has been formed in the mask layer 160, each being formed above respective a metal line 132 between a pair of rows. The mask layer 160 may for instance be a spin-on layer or layer stack, such as a spin-on-carbon (SOC) and spin-on-glass (SOG). The trench openings 162 may be formed using lithography and etching.

In FIG. 17, the metal lines 132 below the trench openings 162 have been removed in a metal etch, and the underlying semiconductor material of the lower source/drain layer 102 has subsequently been etched to form a trenches 164 dividing the lower source/drain layer 102 into separate lower source/drain layer portions 102a. The mask layer 160 may subsequently be removed. If the optional barrier liner 150 has been formed, the barrier liner 150 may first be opened, e.g., by a short oxide or dielectric etch step, thereby exposing the respective metal lines 132.

Figure 18:
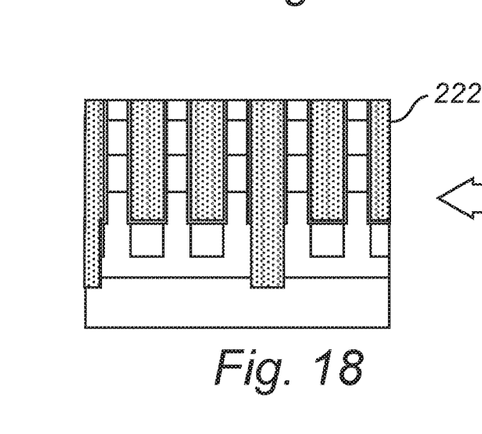

In FIG. 18, the trenches 164 have been filled with an insulating layer 222, also at least partly embedding the pillars 110. The method may thereafter proceed with gate structure formation and upper source/drain contact formation, as set out above.

FIGS. 19-22 illustrate a further variation of a method of forming a semiconductor device comprising VFET devices. The FIGS. 19-22 illustrate in plan view cross sections of a part of the array 104, taken along a column direction, across a number of rows R1-R3 etc. Like reference numerals in FIGS. 1-12 and 19-22 can refer to like elements, e.g., unless otherwise stated.

Figure 19:
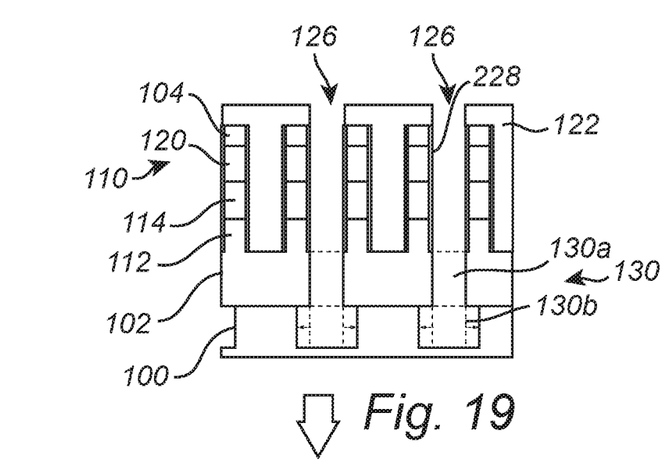
FIGS. 19, 20, 21, and 22 illustrate various intermediate structures of a further method of forming a semiconductor device.

The method generally proceeds in a similar manner as the above however differs in the manner the metal line trenches 130 and metal lines 132 are formed. FIG. 19 shows the pillars 110 after formation of a cover layer 122. Trenches 126 have been formed between a number rows of the array 104.

Further, metal line trenches 130 have been formed by etching through the lower source/drain layer 102 and into the substrate 100 below, thereby forming an upper trench portion 130a in the lower source/drain layer 102 and a lower trench portion 130b in underlying layer of the substrate 100. Subsequently, a lateral etch back of sidewalls of the lower trench portions 130b may be performed to form widened lower trench portions 130b (schematically indicated by the arrows in the lower trench portions 130b to form a wider lower trench portion 130b in comparison to the upper trench portion 130a). The initial etching of the lower source/drain layer 102 and the substrate 100 may be achieved in a similar manner as discussed above, e.g., by a wet or dry etching process allowing etching of semiconductor material, such as SiGe and/or Si. The lateral etch back may comprise an isotropic etching of the substrate 100, e.g., selectively to the lower source/drain layer 102. Etch contrast between the lower source/drain layer 102 and the substrate 100 may be provided for instance if the lower source/drain layer 102 is formed of SiGe and the etched thickness portion of the substrate 100 is formed by Si. During the etching of the metal line trenches 130 a spacer layer 128 may mask the sidewalls of the pillars 110, e.g., as discussed above.

Figure 20:
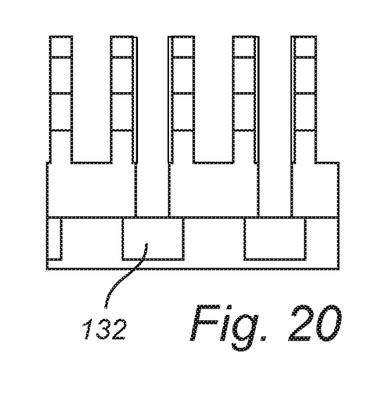

In FIG. 20, the metal lines 132 have been formed in the widened lower trench portions 130b. As shown, each metal line 132 can contact an underside of the lower source/drain layer 102.

Figure 21:
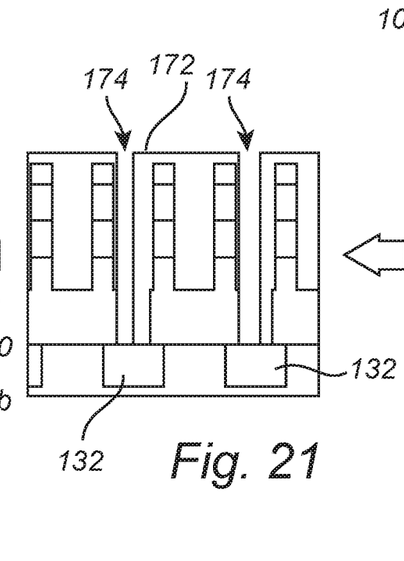
Figure 22:
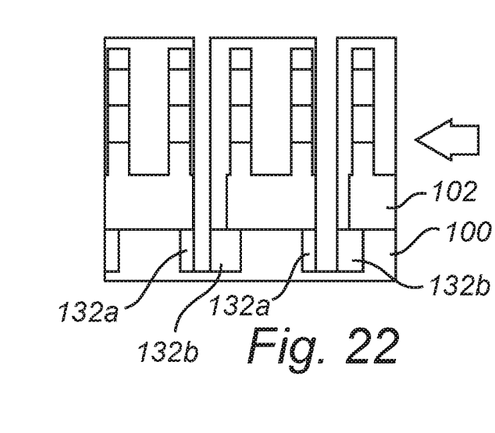

FIGS. 21 and 22 show how a cut may be formed in each metal line 132, e.g., the cut extending in a longitudinal direction of the metal lines (e.g., in the row direction R), thereby forming two separate (e.g., parallel in some instances) metal line parts 132a, 132b in each widened lower trench portion 130b. In FIG. 21, a mask 172 has been formed defining trench-shaped openings 174, each exposing an upper surface of a longitudinal part of each metal line 132. The mask layer 172 may for instance be a spin-on layer or layer stack, such as a spin-on-carbon (SOC) and spin-on-glass (SOG). The trench openings 174 may be formed using lithography and etching. In FIG. 22, the metal lines 132 have been cut by performing a metal etch through the trench openings 174. The method may thereafter proceed at least partly covering the metal lines 132a, 132b with insulating material, and further gate structure formation and upper source/drain contact formation, e.g., as set out above.

While methods and processes may be depicted in the drawings and/or described in a particular order, it is to be recognized that the steps need not be performed in the particular order shown or in sequential order, or that all illustrated steps be performed, to achieve desirable results. Further, other steps that are not depicted may be incorporated in the example methods and processes that are schematically illustrated. For example, one or more additional steps may be performed before, after, simultaneously, or between any of the illustrated steps. Additionally, the steps may be rearranged or reordered in other embodiments.

In the above the inventive concept has mainly been described with reference to a limited number of examples. However, as is readily appreciated by a person skilled in the art, other examples than the ones disclosed above are equally possible within the scope of the inventive concept, as defined by the appended claims.

What is claimed is:

1. A method of forming a semiconductor device comprising vertical channel field-effect transistor devices, the method comprising:
    forming on a substrate a plurality of semiconductor structures protruding vertically from a lower source/drain layer of the substrate, the semiconductor structures being arranged in an array having a plurality of rows and columns;
    forming a cover layer at least partly embedding the semiconductor structures and at least partly covering the lower source/drain layer;
    forming trenches in the cover layer, the trenches extending through the cover layer between at least a subset of the rows;
    etching metal line trenches between the at least a subset of the rows, wherein etching the metal line trenches comprises etching the lower source/drain layer via the trenches in the cover layer;
    forming metal lines in the metal line trenches, in contact with the lower source/drain layer;
    forming gate structures at least partly enclosing channel portions of the semiconductor structures located above the lower source/drain layer; and
    forming upper source/drain metal contacts on upper source/drain portions of the semiconductor structures located above the channel portions.

2. The method according to claim 1, further comprising, prior to forming the metal lines, forming an insulating spacer layer on sidewalls of the semiconductor structures along the at least a subset of rows.

3. The method according to claim 2, wherein the spacer layer is formed prior to forming the metal line trenches.

4. The method according to claim 1, wherein the trenches in the cover layer expose sidewalls of the semiconductor structures arranged along the at least a subset of the rows, and the method further comprises forming an insulating spacer layer on sidewalls of the semiconductor structures exposed in the trenches in the cover layer.

5. The method according to claim 1, further comprising, prior to forming the cover layer, depositing a conformal layer at least partly covering the semiconductor structures and the lower source/drain layer, and
    wherein subsequent to forming the cover layer, forming the trenches in the cover layer comprises etching the cover layer selectively with respect to the conformal layer.

6. The method according to claim 1, wherein the metal lines are formed with a height which is greater than a depth of the metal line trenches.

7. The method according to claim 1, wherein forming the metal lines comprises depositing a metal line material in the metal line trenches and etching back the deposited metal line material to a level below the channel portions.

8. The method according to claim 1, further comprising at least partly covering the metal lines with an insulating layer, wherein the gate structures are formed on the insulating layer.

9. The method according to claim 1, wherein each upper source/drain metal contact is formed on upper source/drain portions of the semiconductor structures of at least two consecutive rows.

10. The method according to claim 9, wherein each upper source/drain metal contact extends over and across at least one of the metal lines.

11. The method according to claim 1, further comprising, prior to or after forming the metal lines: forming trenches in the lower source/drain layer between a number of the rows of the array, and filling the trenches formed between the number of the rows with an insulating material, thereby dividing the lower source/drain layer into a number of lower source/drain layer portions, wherein at least one metal line trench and metal line are formed in each lower source/drain layer portion.

12. The method according to claim 11, wherein a metal line trench and a metal line are formed between every row of semiconductor structures supported by each lower source/drain portion.

13. The method according to claim 1, wherein etching the metal line trenches comprises:
    etching through the lower source/drain layer and into the substrate below, thereby forming upper trench portions in the lower source/drain layer and lower trench portions in the substrate, and
    performing a lateral etch back of sidewalls of the lower trench portions to form widened lower trench portions in comparison to the upper trench portions,
    wherein the metal lines are formed in at least the widened lower trench portions.

14. The method according to claim 13, further comprising cutting each metal line in a longitudinal direction thereof, thereby forming two metal line parts in each widened lower trench portion.

15. The method according to claim 13, wherein the metal lines contact an underside of the lower source/drain layer.

16. The method according to claim 14, wherein the two metal line parts are separate and parallel to one another.

17. The method according to claim 1, wherein the metal line trenches are parallel to the rows.

18. The method according to claim 1, further comprising connecting the metal lines to a back-end-of-line interconnect.

19. The method according to claim 1, wherein the vertical channel field-effect transistor devices arranged along a pair of adjacent rows are connected to a common metal line formed therebetween.

20. A method of forming a semiconductor device comprising vertical channel field-effect transistor devices, the method comprising:
    forming on a substrate a plurality of semiconductor structures protruding vertically from a lower source/drain layer of the substrate, the semiconductor structures being arranged in an array having a plurality of rows and columns;
    etching metal line trenches between at least a subset of the rows;
    forming metal lines in the metal line trenches, in contact with the lower source/drain layer;
    forming gate structures at least partly enclosing channel portions of the semiconductor structures located above the lower source/drain layer; and
    forming upper source/drain metal contacts on upper source/drain portions of the semiconductor structures located above the channel portions, wherein each upper source/drain metal contact is formed on upper source/drain portions of the semiconductor structures of at least two consecutive rows.

21. A method of forming a semiconductor device comprising vertical channel field-effect transistor devices, the method comprising:
    forming on a substrate a plurality of semiconductor structures protruding vertically from a lower source/drain layer of the substrate, the semiconductor structures being arranged in an array having a plurality of rows and columns;

etching metal line trenches between at least a subset of the rows;

forming metal lines in the metal line trenches, in contact with the lower source/drain layer;

prior to or after forming the metal lines, forming trenches in the lower source/drain layer between a number of the rows of the array;

filling the trenches formed between the number of the rows with an insulating material, thereby dividing the lower source/drain layer into a number of lower source/drain layer portions, wherein at least one metal line trench and metal line are formed in each lower source/drain layer portion;

forming gate structures at least partly enclosing channel portions of the semiconductor structures located above the lower source/drain layer; and forming upper source/drain metal contacts on upper source/drain portions of the semiconductor structures located above the channel portions.

* * * * *

UNITED STATES PATENT AND TRADEMARK OFFICE
CERTIFICATE OF CORRECTION

| | | |
|---|---|---|
| PATENT NO. | : 11,217,488 B2 | Page 1 of 1 |
| APPLICATION NO. | : 16/835786 | |
| DATED | : January 4, 2022 | |
| INVENTOR(S) | : Anabela Veloso | |

It is certified that error appears in the above-identified patent and that said Letters Patent is hereby corrected as shown below:

On the Title Page

Column 1 (Assignee), Line 1, delete "zvw," and insert --vzw,--.

In the Specification

Column 5, Line 35, delete "$1 \pm y$." and insert --$x \neq y$.--.

Column 12, Line 3, delete "number" and insert --number of--.

Signed and Sealed this
Fifth Day of April, 2022

Drew Hirshfeld
*Performing the Functions and Duties of the*
*Under Secretary of Commerce for Intellectual Property and*
*Director of the United States Patent and Trademark Office*